United States Patent
Ohmori et al.

(10) Patent No.: US 8,945,730 B2
(45) Date of Patent: Feb. 3, 2015

(54) STORAGE ELEMENT AND MEMORY DEVICE

(75) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Kazutaka Yamane, Kanagawa (JP); Hiroyuki Uchida, Kanagawa (JP); Tetsuya Asayama, Tokyo (JP)

(73) Assignee: Sony Corporation, Tokyo (JP)

( * ) Notice: Subject to any disclaimer, the term of this patent is extended or adjusted under 35 U.S.C. 154(b) by 232 days.

(21) Appl. No.: 13/310,846

(22) Filed: Dec. 5, 2011

(65) Prior Publication Data

US 2012/0148874 A1  Jun. 14, 2012

(30) Foreign Application Priority Data

Dec. 13, 2010 (JP) ................. 2010-276590

(51) Int. Cl.
- *H01L 43/10* (2006.01)
- *H01L 27/22* (2006.01)
- *G01R 33/09* (2006.01)
- *H01L 43/08* (2006.01)

(52) U.S. Cl.
CPC ............ *H01L 27/228* (2013.01); *G01R 33/098* (2013.01); *G01R 33/093* (2013.01); *G01R 33/091* (2013.01); *H01L 43/08* (2013.01); *H01L 43/10* (2013.01)
USPC .................. 428/811.1; 428/811.3; 428/811.5; 428/812

(58) Field of Classification Search
None
See application file for complete search history.

(56) References Cited

U.S. PATENT DOCUMENTS

| | | | | |
|---|---|---|---|---|
| 7,463,457 B2 * | 12/2008 | Hasegawa et al. | ........ | 360/324.11 |
| 7,596,015 B2 * | 9/2009 | Kitagawa et al. | ............ | 365/158 |
| 8,488,375 B2 * | 7/2013 | Saida et al. | .................... | 365/171 |
| 8,488,376 B2 * | 7/2013 | Ranjan et al. | .................. | 365/171 |
| 8,498,150 B2 * | 7/2013 | Ranjan et al. | .................. | 365/171 |
| 2004/0165425 A1 | 8/2004 | Nakamura et al. | | |
| 2005/0168888 A1 * | 8/2005 | Miyauchi et al. | ........ | 360/324.12 |
| 2008/0191295 A1 * | 8/2008 | Ranjan et al. | .................. | 257/421 |
| 2009/0080124 A1 | 3/2009 | Yoshikawa et al. | | |
| 2011/0044099 A1 * | 2/2011 | Dieny | ............ | 365/171 |
| 2011/0279921 A1 * | 11/2011 | Zhang et al. | .................... | 360/59 |
| 2012/0069471 A1 * | 3/2012 | Lin | .......................... | 360/123.37 |
| 2012/0205758 A1 * | 8/2012 | Jan et al. | ....................... | 257/421 |

FOREIGN PATENT DOCUMENTS

| | | |
|---|---|---|
| JP | 2004-193595 | 7/2004 |
| JP | 2009-081215 | 4/2009 |

\* cited by examiner

*Primary Examiner* — Kevin Bernatz
(74) *Attorney, Agent, or Firm* — Dentons US LLP

(57) ABSTRACT

A storage element including: a storage layer; a magnetization fixed layer; and an insulating layer, wherein by injecting spin-polarized electrons in a laminating direction of a layered structure that includes the storage layer, the insulating layer, and the magnetization fixed layer, the orientation of magnetization of the storage layer changes and recording of information is performed on the storage layer, and an Fe film and a film that includes Ni are formed in order from an interface side that is in contact with the insulating layer, and a graded composition distribution of Ni and Fe is formed after heating on at least one of the storage layer and the magnetization fixed layer.

14 Claims, 17 Drawing Sheets

STORAGE ELEMENT AND MEMORY DEVICE

BACKGROUND

The present disclosure relates to a non-volatile storage element that includes a storage layer that stores information on the magnetization state of a ferromagnetic layer, an insulating layer, and a magnetization fixed layer in which the direction of magnetization is fixed and which changes the direction of the magnetization of the storage layer by running a current, and a memory device that includes the storage element.

In information apparatuses such as computers, DRAMs with fast operations and high density are widely used as Random Access Memories. Since a DRAM is a volatile memory in which information is lost if the power supply is cut, there is demand for a non-volatile memory in which information is not lost.

As a candidate for a non-volatile memory, Magnetic Random Access Memories (MRAM) that record information by the magnetization of a magnetic body has attracted attention and is being developed.

As a method of performing recording in an MRAM, there is a method of inverting the magnetization by the current magnetic field, or as in Japanese Unexamined Patent Application Publication No. 2004-193595, for example, a method of causing magnetic inversion by injecting spin-polarized electrons in a direct recording layer. In particular, spin injection magnetization inversion in which the recording current is made smaller along with the size of the elements has been attracting attention.

Furthermore, in order to miniaturize the elements, a method of using a vertical magnetization film in which the magnetization direction of a magnetization body is pointed in the vertical direction as in Japanese Unexamined Patent Application Publication No. 2009-81215, for example, has been considered.

SUMMARY

A vertical magnetization film that is used for such magnetic memory elements is heat-resistant up to between approximately 300° C. and 400° C. in order to go through a semiconductor manufacturing process.

However, common amorphous vertical magnetization films such as TbFeCo have low heat resistance. Further, with FePt or the like that is an ordered phase, a high temperature of approximately 700° C. is necessary to obtain sufficient characteristics, and a tunneling barrier or the like that forms the magnetic memory elements is not able to bear the high temperature heating process.

It is desirable to realize, in a magnetic memory using spin torque, a magnetic memory in which vertical magnetization is obtained in a heating process of an appropriate temperature of between 300° C. and 400° C. and which is able to be produced easily using a semiconductor process.

A storage element according to an embodiment of the disclosure includes: a storage layer with magnetization that is vertical to a film surface and in which the orientation of magnetization changes corresponding to information; a magnetization fixed layer with magnetization that is vertical to a film surface that is to be a reference of information that is stored in the storage layer; and an insulating layer composed of an oxide which is provided between the storage layer and the magnetization fixed layer, wherein by injecting spin-polarized electrons in a laminating direction of a layered structure that includes the storage layer, the insulating layer, and the magnetization fixed layer, the orientation of magnetization of the storage layer changes and recording of information is performed on the storage layer. Furthermore, an Fe film and a film that includes Ni (Ni film, NiB film, alloyed film or laminated film of Ni and Pd, or the like) are formed in order from an interface side that is in contact with the insulating layer, and a graded composition distribution of Ni and Fe is formed after heating on at least one of the storage layer and the magnetization fixed layer.

The film that includes Ni is an Ni film, an NiB film, an alloyed film or a laminated film of Ni and Pd, or the like.

A memory device according to an embodiment of the disclosure includes the storage element of the above configuration as a storage element that retains information by the magnetization state of a magnetic body, and two types of wiring that intersect each other. In the memory device, the storage element is arranged between the two types of wiring and spin-polarized electrons are injected by a current in the laminating direction flowing to the storage element through the two types of wiring.

With such embodiments of the disclosure, although the storage layer and the magnetization fixed layer are vertical magnetization films, the effect of increasing the interface magnetic anisotropy by providing an increased amount of Fe particularly on an interface with the insulating layer of an oxide such as MgO is obtained.

In particular, in a magnetic storage element that performs magnetic inversion using spin torque by a polarized current by causing a current to flow between the magnetization fixed layer and the storage layer via the insulating layer (tunneling barrier layer), the storage layer and the magnetization fixed layer form an Fe film with an appropriate thickness on an interface with the insulating layer. Further, by forming a film that includes Ni with an appropriate thickness to be in contact with the Fe film and performing a heating process by an appropriate temperature of between 300° C. and 400° C., it was found that a stable vertical magnetization film is obtained.

According to the embodiments of the disclosure, the storage layer or the magnetization fixed layer of a storage element in which recording of information is performed in the storage layer by injecting spin-polarized electrons in a laminating direction of a layered structure that includes a storage layer, an insulating layer, and a magnetization fixed layer has an Fe film with an appropriate thickness on an interface with the insulating layer and further a film that includes Ni with an appropriate thickness in contact with the Fe film which are formed in order. Furthermore, a graded composition distribution of Ni and Fe is formed after heating. With such a storage element, by performing a heating process by a temperature of between approximately 300° C. and 400° C., it is possible to obtain a stable vertical magnetization film and it is possible to produce the vertical magnetization film using a semiconductor process with good producibility.

That is, the vertical magnetization film of the storage element according to the embodiments of the disclosure is able to realize a non-volatile memory with high heat resistance, which is easily applied to a semiconductor process, and which has excellent producibility.

DETAILED DESCRIPTION OF EMBODIMENTS

The embodiments of the disclosure will be described below in the following order.

<1. Configurations of Memory Device and Storage Element of Embodiments>
<2. Experiments>
 [2-1: Fe—Ni]
 [2-2: Fe—Pd]
 [2-3: Fe—$Ni_{85}B_{15}$]
 [2-4: Fe—$Ni_{90}B_{10}$]
 [2-5: NiB Composition Dependence in Fe—NiB]
 [2-6: Film Thickness Dependence in Fe-(Various Types of Ni and Pd)]
 [2-7: Composition Dependence in FeCo—NiB]
 [2-8: Film Thickness Dependence in Fe—Ni—Fe]
 [2-9: Graded Composition Distribution of Fe, Ni]

1. Configurations of Memory Device and Storage Element of Embodiments

The embodiments of the disclosure perform recording of information by inverting the orientation of the magnetization of the storage layer of the storage element by spin injection. The storage layer is configured by a magnetic body such as a ferromagnetic layer and retains information by the magnetization state (orientation of magnetization) of the magnetic body.

Figure 1:
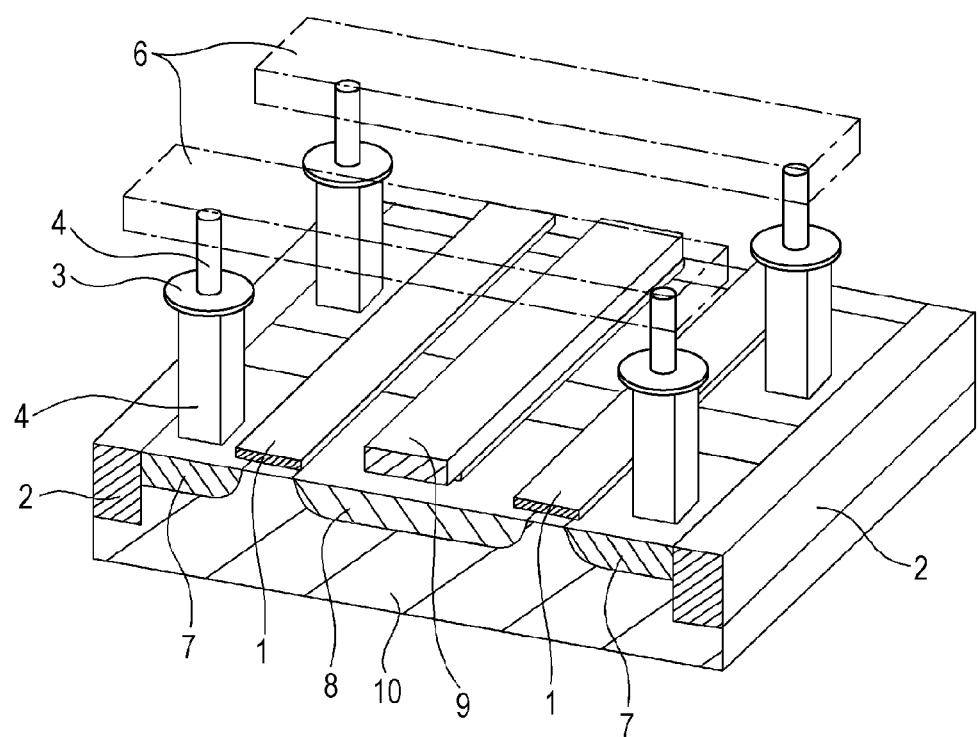
FIG. 1 is an explanatory diagram of an outline configuration of a memory device according to embodiments of the disclosure.

An outline configuration diagram (schematic diagram) of a memory device as an embodiment of the disclosure is illustrated in FIG. 1. The memory device has a storage element 3 that is able to retain information by a magnetization state which is arranged in the vicinity of an intersection between two types of address wiring (for example, a word line and a bit line) that intersect each other. That is, a drain region 8, a source region 7, and a gate electrode 1 that configure a selecting transistor for selecting each memory cell are respectively formed in a portion that is separated by an element separation layer 2 of a semiconductor substrate 10 such as a silicon substrate. Among such components, the gate electrode 1 also includes one of the address wiring (for example, word line) that extends in the longitudinal direction in the drawing.

The drain region 8 is formed in common on the selecting transistor to the left and the right in the drawing, and wiring 9 is connected to the drain region 8.

Furthermore, the storage element 3 is arranged between the source region 7 and the other address wiring (for example, a bit line) 6 that extends in the horizontal direction in the drawing, which is arranged to the upper side. The storage element 3 includes a storage layer that is composed by a ferromagnetic layer in which the orientation of magnetization is inverted by spin injection.

Further, the storage element 3 is arranged in the vicinity of an intersection of the two types of address wiring 1 and 6.

The storage element 3 is connected to the bit line 6 and the source region 7 respectively via contact layers 4 above and below.

In so doing, it is possible to cause a current to flow in the longitudinal direction to the storage element 3 through the two types of address wiring 1 and 6 and to invert the orientation of the magnetization of the storage layer by spin injection.

Figure 2:
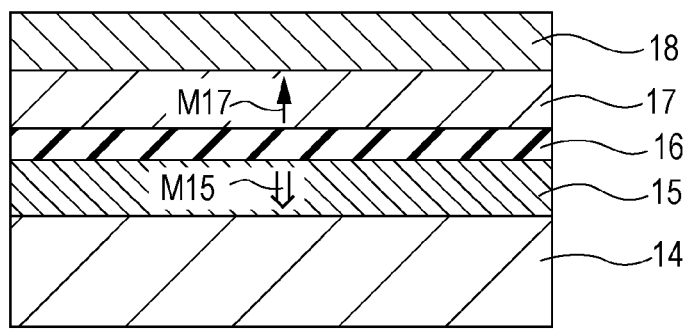
FIG. 2 is a cross-sectional diagram of a storage element according to an embodiment.

Further, a cross-sectional diagram of the storage element 3 of the memory device of the embodiment is illustrated in FIG. 2.

As illustrated in FIG. 2, in the storage element 3, a base layer 14, a magnetization fixed layer 15, an insulating layer 16, a storage layer 17, and a cap layer 18 are laminated in that order from the lower layer side.

In such a case, the magnetization fixed layer 15 is provided on a lower layer with respect to the storage layer 17 in which the orientation of magnetization M17 is inverted by spin injection.

In a spin injection type memory, information "0" and "1" are regulated by the relative angles of the magnetization M17 of the storage layer 17 and magnetization M15 of the magnetization fixed layer 15.

The insulating layer 16 that is a tunneling barrier layer (tunneling insulating layer) is provided between the storage layer 17 and the magnetization fixed layer 15, and an MTJ (Magnetic Tunneling Junction) element is configured by the storage layer 17 and the magnetization fixed layer 15.

Further, the base layer 14 is formed under the magnetization fixed layer 15, and the cap layer 18 is formed above the storage layer 17.

The storage unit 17 is configured by a ferromagnetic body that includes a magnetic moment in which the direction of the magnetization M17 changes freely in the layer surface vertical direction. The magnetization fixed layer 15 is configured by a ferromagnetic body that includes a magnetic moment in which the magnetization M15 is fixed to the film surface vertical direction.

The storing of information is performed by the orientation of magnetization of the storage layer 17 that has uniaxial anisotropy. Writing is performed by causing spin torque magnetic inversion by causing a current of a certain threshold value or greater to flow in the film surface vertical direction. In so doing, the magnetization fixed layer 15 is provided on a lower layer than the storage layer 17 in which the orientation of magnetization is inverted by spin injection and the magnetization fixed layer 15 becomes the reference of the storage information (magnetization direction) of the storage layer 17.

Since the magnetization fixed layer 15 is the reference of the information, although the direction of magnetization is not to change by recording or reading, the direction of magnetization is not necessarily fixed to a specific direction, and the coercive force may be caused to be greater, the thickness may be thickened, or the magnetic damping constant may be caused to be greater than the storage layer 17 so that the magnetization fixed layer 15 is less easily moved than the storage layer 17.

In a case when the magnetization is to be fixed, antiferromagnetic bodies such as PtMn or IrMn may be caused to be in contact with the magnetization fixed layer 15, or the magnetization fixed layer 15 may be indirectly fixed by causing a magnetic body that is in contact with such an antiferromagnetic body to be magnetically bonded with a nonmagnetic body such as Ru.

The storage element 3 of the embodiments is able to be manufactured by forming from the base layer 14 to the cap layer 18 consecutively in a vacuum device and forming the pattern of the storage element 3 by treatments such as etching thereafter.

The embodiments are to realize, as the storage element 3 that uses spin torque of the configuration described above, a storage element in which vertical magnetization is obtained by a heating process at an appropriate temperature of between approximately 300° C. and 400° C. and which is able to be easily produced using a semiconductor process.

That is, a configuration in which vertical magnetization is obtained easily as the storage layer 17 or the magnetization fixed layer 15 is realized.

As a result of considering the above embodiments, in the storage layer 17 or the magnetization fixed layer 15, an Fe film with an appropriate thickness is formed on an interface with the insulating layer 16 (tunneling barrier layer), and a film that includes Ni of an appropriate thickness is further formed in contact with the Fe film. The film that includes Ni is, for example, an Ni film, an NiB film, an alloyed film of Ni and Pd, a laminated film of Ni and Pd, or the like.

In such a case, a stable vertical magnetization film was found by performing a heating process within an appropriate range of between 300° C. and 450° C.

A graded composition distribution of Ni and Fe is formed in the storage layer 17 or the magnetization fixed layer 15 after the heating process. As described later in FIGS. 18A and 18B, forming a graded composition distribution in which the composition ratio of Fe with respect to Ni is large (equal to or greater than 50%) on an interface side with the insulating layer 16 is appropriate.

As an oxide film that uses the insulating layer 16, if MgO is used, the magnetic resistance ratio (MR ratio) is preferably great. The reason is that by increasing the MR ratio, the efficiency of spin injection is increased and the current density that is used to invert the orientation of the magnetization Ml of the storage layer 17 is thus reduced.

However, even if an oxide other than MgO, for example, $TiO_2$, $MgAl_2O_4$, or $Al_2O_3$ is used as the insulating layer 16, such an oxide is effective for the vertical magnetization of the storage layer 17 or the magnetization fixed layer 15.

The production of such oxides may use an RF sputtering method using an oxide target, or the films may be formed in an atmosphere of oxygen with a metallic target. Further, the oxides may be oxidized by being left in an atmosphere of oxygen or in an atmosphere of plasma that includes oxygen for an appropriate amount of time after forming the metallic layer, or a chemical vapor deposition (CVD) method may be used.

Since a certain amount of Fe is used for the interface of the magnetic body which is in contact with the oxide, if there is less than 50 atomic % of Fe, vertical magnetization is not able to be obtained.

Further, if there is too much Fe other than on the interface, the saturated magnetization of the magnetic body increases and vertical magnetization is not able to be obtained.

Therefore, in order to obtain vertical magnetization effectively, a configuration in which a magnetic body with little saturated magnetization with Fe on a portion that is in contact with the oxide and Ni or the like at other locations may be adopted.

However, although the elements of each layer are mutually dispersed when heated and the films attain a graded composition, a favorable vertical magnetization film is obtained by forming and heating by appropriately setting the film thickness of Fe and the film thickness of Ni.

Although the heating temperature may be appropriately mixed with an appropriate composition distribution of Fe and Ni, a heating temperature with which the composition ratio of Fe at the interface with the oxide layer (for example, the insulating layer 16) does not fall below 50% is preferable.

Here, even if Pd is used instead of Ni, since the Fe atoms are appropriately dispersed in the Pd and magnetization is caused in the Pd layer, a similar effect to Ni is obtained.

Therefore, as a film that includes Ni, a laminate of Ni and Pd or an alloy of Ni and Pd may be used.

Further, an additional element may be added to the Fe film or the Ni film. The vertical magnetic anisotropy does not greatly decrease even if 30 atomic % or less of Co as a magnetic element is added to the Fe film.

Furthermore, the vertical magnetization is maintained even if a certain amount of additional element is added to Ni. In particular, since adding B improves the vertical magnetic anisotropy, doing so is preferable.

Therefore, in the embodiments, on the storage layer 17, the Fe film and the film that includes Ni are formed in order from the interface side that is in contact with the insulating layer, and a graded composition distribution with a large composition ratio of Fe with respect to Ni is formed on the interface side after a heating process.

The storage layer 17 between the insulating layer 16 of MgO and the cap layer 18 of Ta or the like, for example, the Fe film and the Ni film are formed being viewed from the insulating layer 16 side, and the Fe film and the Ni film are heated.

In such a case, it is preferable that the Fe film have a film thickness of between 0.4 and 0.5 nm, and the Ni film have a film thickness of between 1.7 and 2.5 nm.

Here, even if a Pd film is formed instead of the Ni film, depending on the heating temperature, vertical magnetization may still be easy.

Further, on the storage layer 17, the Fe film and the NiB film are formed being viewed from the insulating layer 16 side, and the Fe film and the NiB film are heated. In such a case, it is preferable that the composition of the NiB film be equal to or less than 20 atomic % of B.

In particular, in a case when the NiB film includes substantially 15 atomic % of B, it is preferable that the film thickness of the Fe film be between 0.4 and 0.8 nm and the film thickness of the NiB film be between 1.6 and 2.6 nm.

Further, in a case when the NiB film includes substantially 10 atomic % of B, it is preferable that the film thickness of the Fe film be between 0.4 and 0.7 nm and the film thickness of the NiB film be between 1.0 and 3.0 nm.

Further, on the storage layer 17, the Fe film or an alloyed film or a laminated film of Ni and Pd are formed being viewed from the insulating layer 16 side, and the Fe film or the alloyed film or the laminated film of Ni and Pd are heated.

Further, on such a storage layer 17, the Fe film that is in contact with the insulating layer 16 side may have equal to or less than 30 atomic % of Co added thereto.

Further, the storage layer 17 may have a configuration of being interposed between the insulating layer 16 composed of an oxide such as MgO and a cap layer 18 composed by another oxide, for example, MgO, having a first Fe film, the Ni film, and a second Fe film formed in order from the interface side that is in contact with the insulating layer 16, and having the second Fe film being in contact with another oxide layer (cap layer 18), and such a configuration may be heated.

In such a case, it is preferable that the film thickness of the first Fe film be between 0.4 and 0.5 nm, the film thickness of the Ni film be between 1.7 and 2.5 nm, and the film thickness of the second Fe film be between 0.2 and 0.7 nm.

Naturally, it is also considered in such a case that an NiB film, an Ni and Pd alloyed film, or an Ni and Pd laminated film is used instead of the Ni film.

Further, in the embodiment, it is appropriate that the magnetization fixed layer 15 also has the Fe film and the film that includes Ni that are formed in order from the interface side that is in contact with the insulating layer, and the magnetization fixed layer 15 has a graded composition distribution in which the composition ratio of Fe with respect to Ni is great (Fe is equal to or greater than 50%) on the interface side after heating formed thereon.

The magnetization fixed layer 15 between the insulating layer 16 of MgO and the base layer 14 of Ta or the like, for example, has the Fe film and the Ni film formed thereon being viewed from the insulating layer 16 side, and the Fe film and the Ni film are heated.

In such a case, it is preferable that the film thickness of the Fe film is between 0.4 and 0.5 nm and the film thickness of the Ni film is between 1.7 and 2.5 nm.

Here, even if a Pd film is formed instead of the Ni film, depending on the heating temperature, vertical magnetization may still be easy.

Further, on the magnetization fixed layer 15, the Fe film and the NiB film are formed being viewed from the insulating layer 16 side, and the Fe film and the NiB film are heated. In such a case, it is preferable that the composition of the NiB film has equal to or less than 20 atomic % of B.

In particular, in a case when the NiB film includes substantially 15 atomic % of B, it is preferable that the film thickness of the Fe film be between 0.4 and 0.8 nm and the film thickness of the NiB film be between 1.6 and 2.6 nm.

Further, in a case when the NiB film includes substantially 10 atomic % of B, it is preferable that the film thickness of the Fe film be between 0.4 and 0.7 nm and the film thickness of the NiB film be between 1.0 and 3.0 nm.

Further, on the magnetization fixed layer 15, the Fe film and an alloyed film or a laminated film of Ni and Pd are formed being viewed from the insulating layer 16 side, and the Fe film and the alloyed film or the laminated film of Ni and Pd are heated.

Further, on such a magnetization fixed layer 15, the Fe film that is in contact with the insulating layer 16 side has equal to or less than 30 atomic % of Co added thereto.

Further, the magnetization fixed layer 15 may have a configuration of being interposed between the insulating layer 16 composed of an oxide such as MgO and a base layer 14 composed by another oxide, for example, MgO, having the first Fe film, the Ni film, and the second Fe film formed in order from the interface side that is in contact with the insulating layer 16, and having the second Fe film being in contact with another oxide layer (base layer 14), and such a configuration may be heated.

In such a case, it is preferable that the film thickness of the first Fe film be between 0.4 and 0.5 nm, the film thickness of the Ni film be between 1.7 and 2.5 nm, and the film thickness of the second Fe film be between 0.2 and 0.7 nm.

Naturally, it is also considered in such a case that an NiB film, an Ni and Pd alloyed film, or an Ni and Pd laminated film is used instead of the Ni film.

The storage element 3 of the embodiment as described above is a storage element 3 in which one or both of the storage layer 17 and the magnetization fixed layer 15 has the Fe film and the film that includes Ni formed in order from the interface side that is in contact with the insulating layer 16, and a graded composition distribution of Ni and Fe is formed on the interface with the insulating layer by the oxide after heating.

The vertical magnetization film (storage layer 17 or magnetization fixed layer 15) of the storage element 3 realizes a non-volatile memory with high heat resistance, easy application to a semiconductor process, and which has excellent producibility.

2. Experiments

[2-1: Fe—Ni]

As an experiment, magnetic characteristic measurement was performed using a sample in which the interface that is in contact with the oxide layer is an Fe film, and an Ni film is formed thereon. First, the change in the vertical anisotropic magnetic field with respect to each film thickness was investigated.

Figure 3:
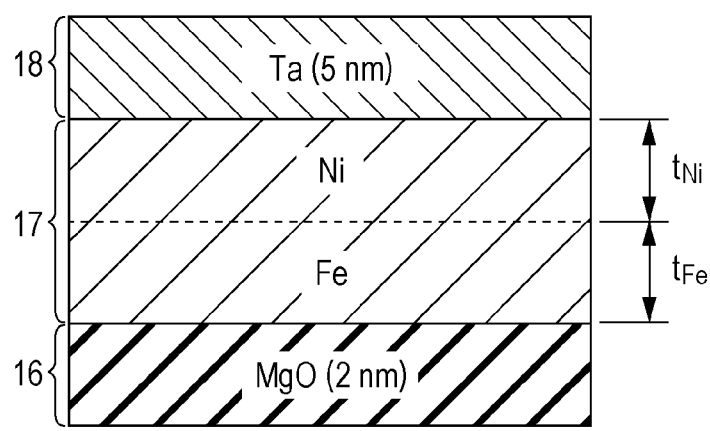
FIG. 3 is an explanatory diagram of a film configuration on which a magnetization characteristic measurement is performed.

As the sample for the magnetic characteristic measurement, as illustrated in FIG. 3, a 2 nm MgO film was formed by DC magnetron sputtering on a silicon substrate with an oxide covering, the Fe film and the Ni film were formed by magnetron sputtering thereon, and 5 nm of Ta was formed as a protective film.

In such a case, it is considered that the MgO film, the Fe film and the Ni film, and the Ta layer are respectively models for the insulating layer 16, the storage layer 17, and the cap layer 18.

Alternatively, the MgO film, the Fe film and the Ni film, and the Ta layer may be considered as the insulating layer 16, the magnetization fixed layer 15, and the base layer 14.

A vertical magnetic anisotropic magnetic field (Hk⊥) in a case when the thickness of the Fe film is $t_{Fe}$ and the thickness of the Ni film is $t_{Ni}$ in a film in which MgO, Fe, Ni, and Ta are laminated in order as in FIG. 3 is illustrated in FIGS. 4A and 4B and 5A and 5B. The horizontal axis is the thickness $t_{Fe}$ of the Fe film and the vertical axis is the thickness $t_{Ni}$ of the Ni film.

A case when the vertical magnetic anisotropic magnetic field Hk⊥ is positive is a vertical magnetization film, and a case when the vertical magnetic anisotropic magnetic field Hk⊥ is negative is an inplane magnetization film. However, since Hk⊥ here has not had a demagnetizing field collection performed thereon, in a case when Hk⊥ is used as a small pattern when being used for the storage element as a magnetic memory, even if Hk⊥ is negative, vertical magnetization is possible up to an extent.

Figure 4A:
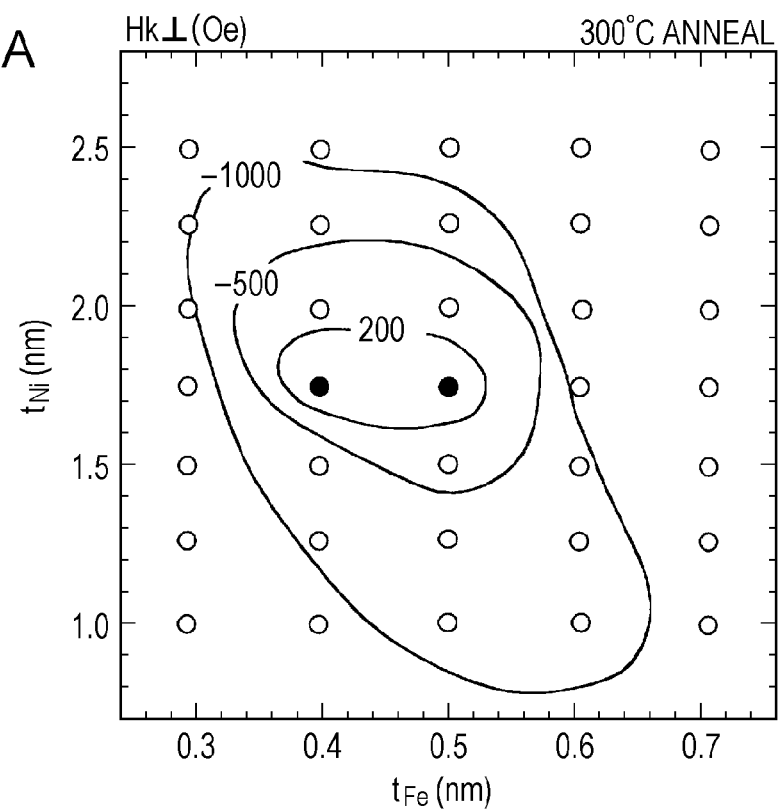
FIGS. 4A and 4B are diagrams that illustrate the change in the vertical anisotropic magnetic field with respect to the Fe film thickness (tFe) and the Ni film thickness (tNi) of MgO, Fe, Ni, and Ta after heating processes of 300° C. and 350° C.
Figure 4B:
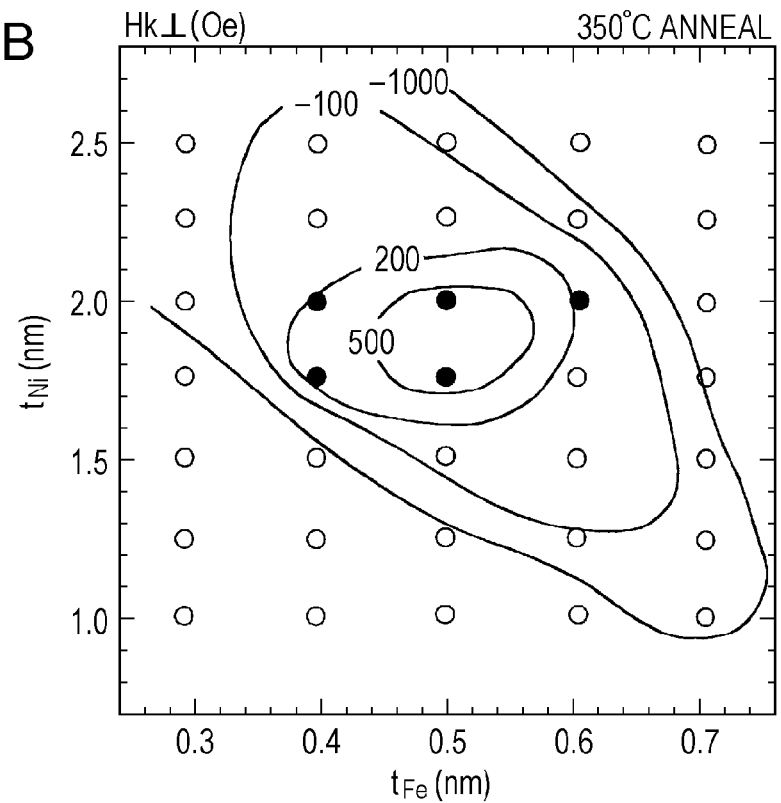
Figure 5A:
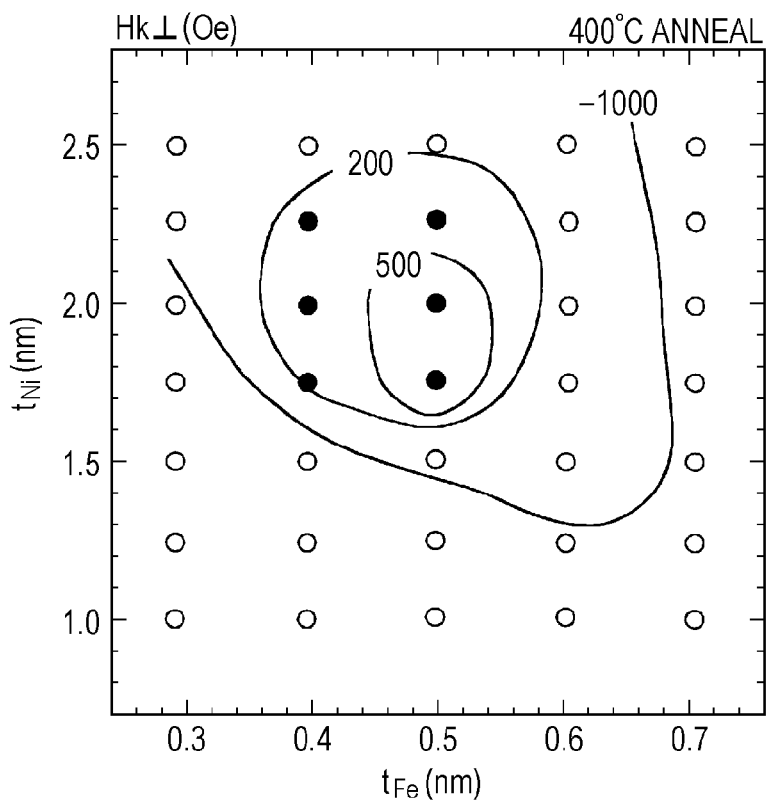
FIGS. 5A and 5B are diagrams that illustrate the change in the vertical anisotropic magnetic field with respect to the Fe film thickness (tFe) and the Ni film thickness (tNi) of MgO, Fe, Ni, and Ta after heating processes of 400° C. and 450° C.
Figure 5B:
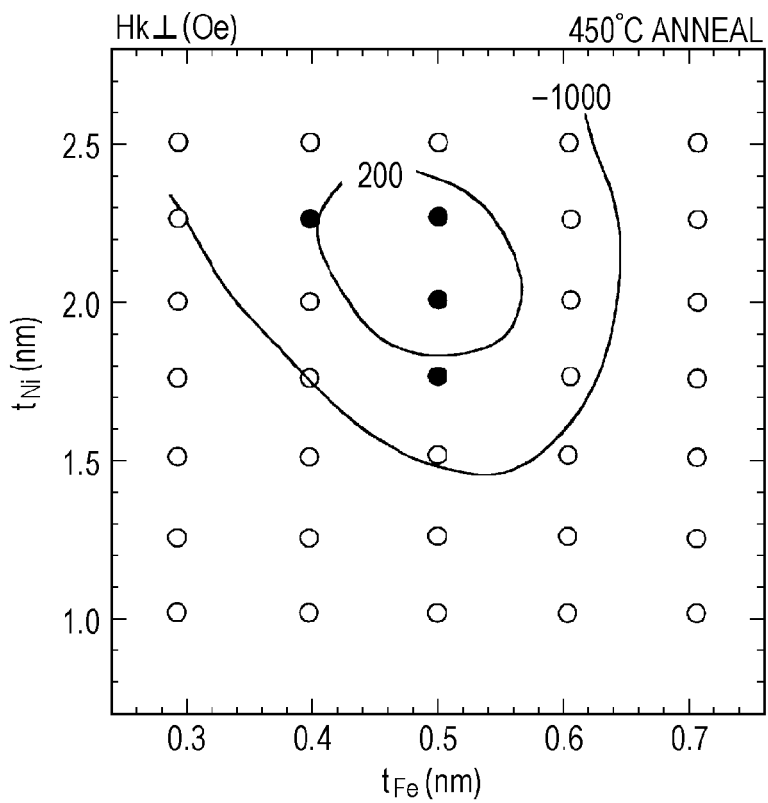

FIGS. 3 and 4A and 4B respectively illustrate the results after heating processes in a case when the annealing temperature was 300° C., 350° C., 400° C., and 450° C.

The contours in each drawing represent vertical anisotropic magnetic fields, and the black circle "●" is a sample in which the square (Mr, Ms) of the vertical magnetization curve is equal to or greater than 0.5 and the while circle "○" is a sample in which the square is less than 0.5.

Ms is saturation magnetization and Mr is remnant magnetization, in a case of complete vertical magnetization, (Mr, Ms) is "1", and in a case of inplane magnetization, (Mr, Ms) is "0". Equal to or greater than 0.5 indicates that it is possible to obtain approximately sufficient vertical magnetic anisotropy.

As is seen from FIGS. 3 and 4A and 4B, although the Fe film thickness and the Ni film thickness that are obtained by the vertical magnetic anisotropy differs depending on the heating process, the conditions for obtaining the vertical magnetization film are met and excellent heat resistance is exhibited at any heating temperature.

In particular, with regard to the ● samples in which (Mr, Ms) is equal to or greater than 0.5, in a case when the Fe film and the Ni film are formed in order from the MgO film side, the film thickness of the Fe film may be between 0.4 and 0.5 nm and the film thickness of the Ni film may be between 1.7 and 2.5 nm.

Within each of the film thickness ranges, by appropriately setting range of the annealing temperature between 300° C. and 450° C., favorable vertical magnetic anisotropy is obtained.

That is, by forming the vertical magnetization film that is the storage layer 17 or the magnetization fixed layer 15 by such film thickness conditions, it is possible to realize a non-volatile memory with high heat resistance, which is easily applied to a semiconductor process, and which has excellent producibility.

[2-2: Fe—Pd]

Next, measurement was performed using Pd instead of Ni.

Figure 6:
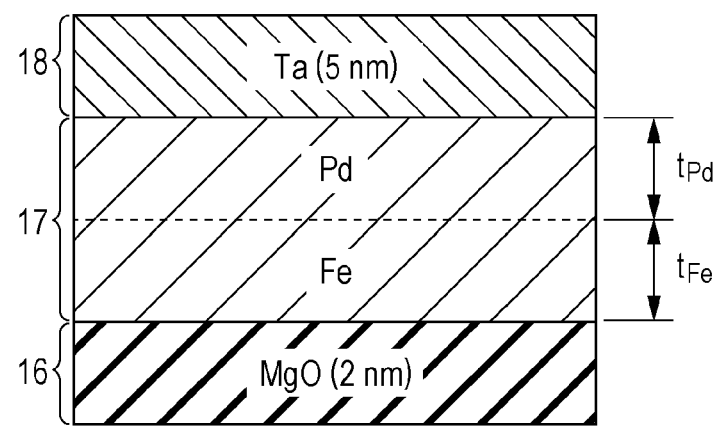
FIG. 6 is another explanatory diagram of a film configuration on which a magnetization characteristic measurement is performed.
Figure 7A:
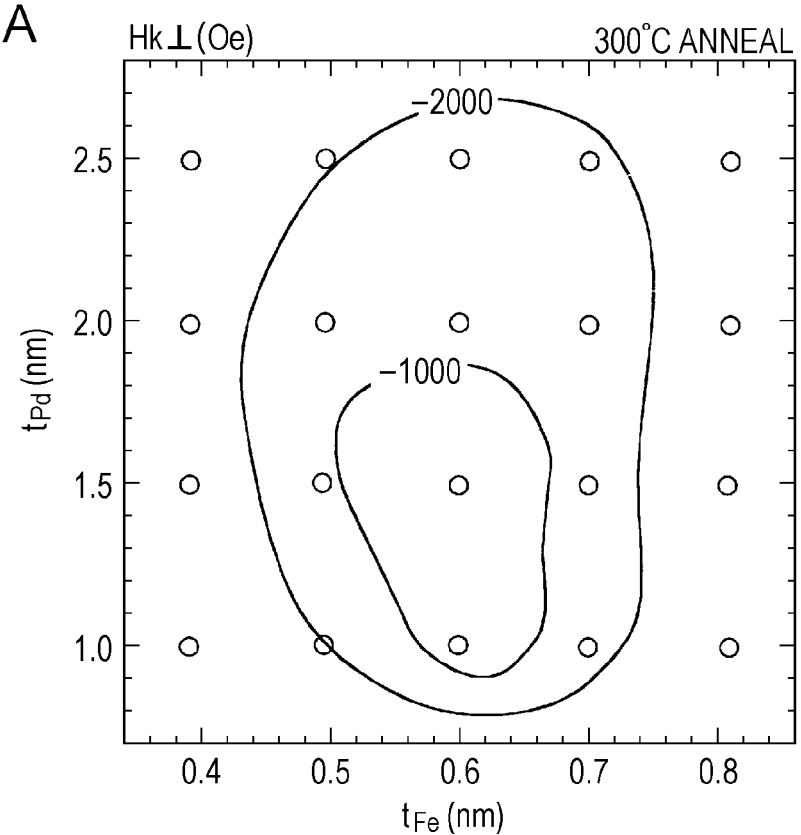
FIGS. 7A and 7B are diagrams that illustrate the change in the vertical anisotropic magnetic field with respect to the Fe film thickness (tFe) and the Pd film thickness (tPd) of MgO, Fe, Pd, and Ta after heating processes of 300° C. and 350° C.
Figure 7B:
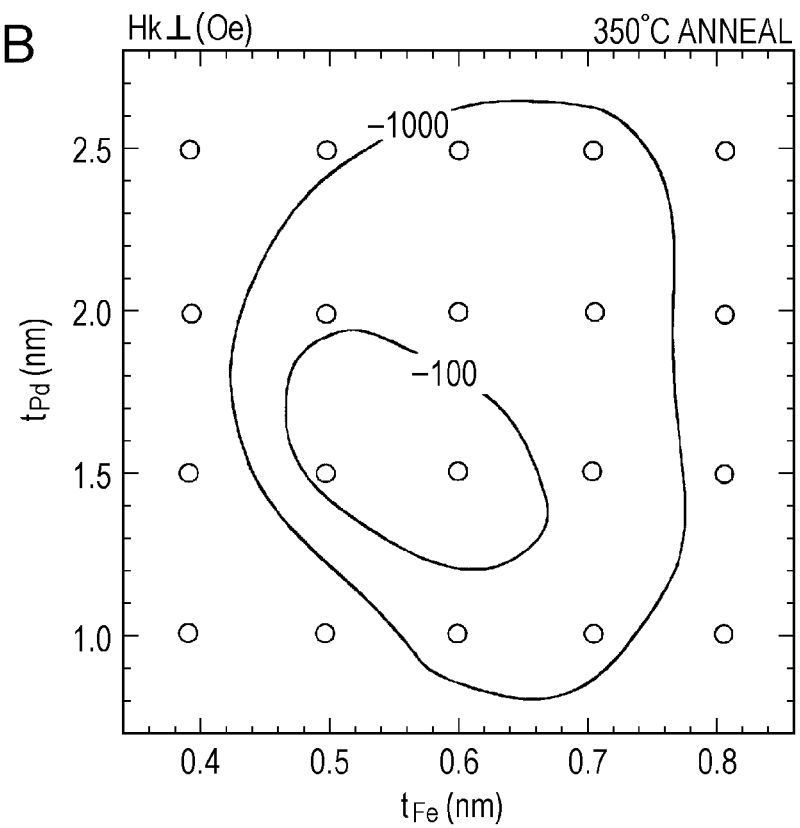
Figure 8A:
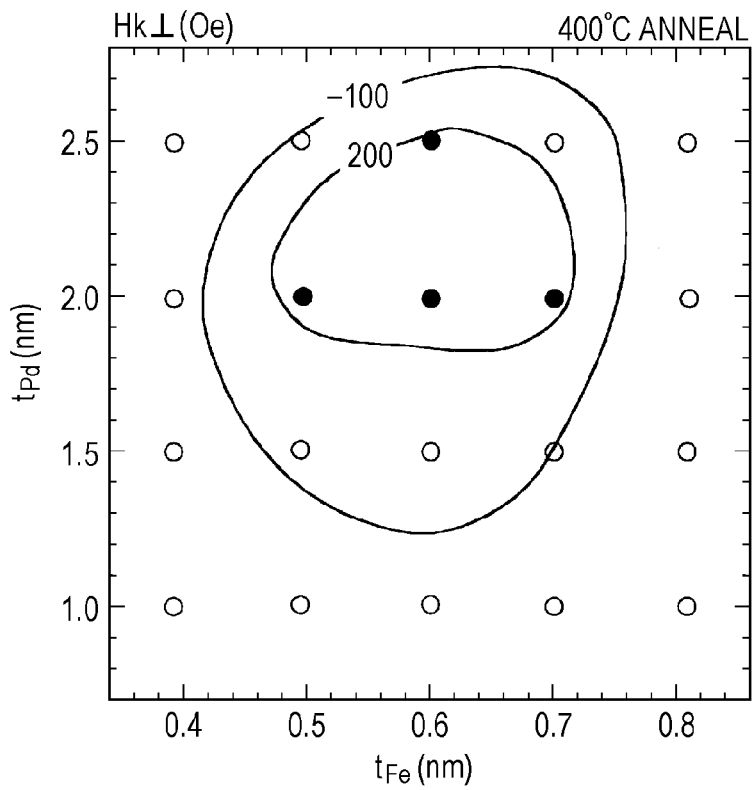
FIGS. 8A and 8B are diagrams that illustrate the change in the vertical anisotropic magnetic field with respect to the Fe film thickness (tFe) and the Pd film thickness (tPd) of MgO, Fe, Pd, and Ta after heating processes of 400° C. and 450° C.
Figure 8B:
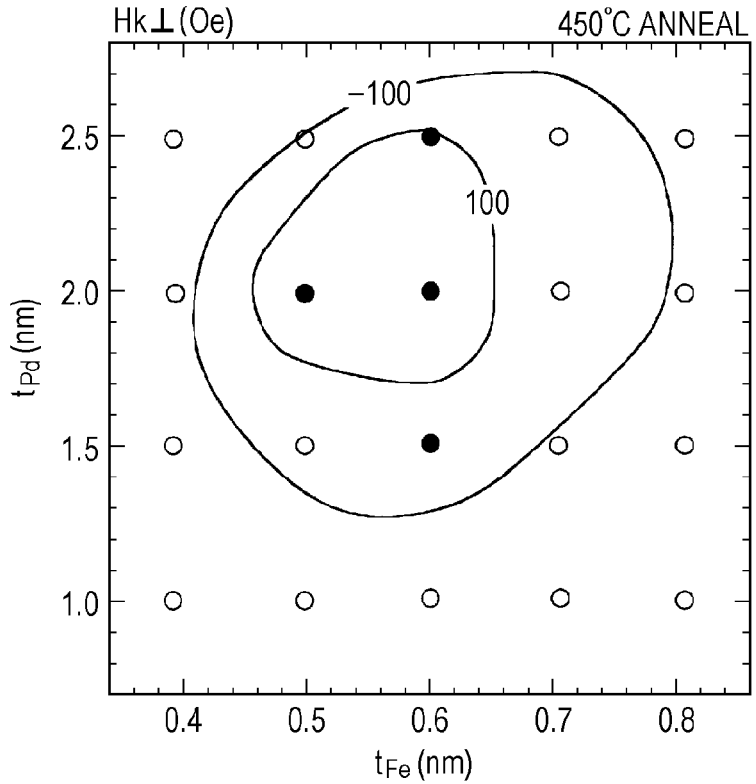

That is, as the sample, as illustrated in FIG. 6, a 2 nm MgO film was formed on a silicon substrate with an oxide covering by RF magnetron sputtering, and the Fe film and the Pd film were formed thereon by DC magnetron sputtering, and 5 nm of Ta was formed as a protective film.

In such a case, it is considered that the MgO film, the Fe film and the Pd film, and the Ta layer are respectively models for the insulating layer 16, the storage layer 17, and the cap layer 18. Alternatively, the MgO film, the Fe film and the Pd film, and the Ta layer may be considered as the insulating layer 16, the magnetization fixed layer 15, and the base layer 14.

The vertical magnetic anisotropic magnetic field (Hk⊥) in a case when the thickness of the Fe film is $t_{Fe}$ and the thickness of the Pd film is $t_{pd}$ in a film in which MgO, Fe, Pd, and Ta are laminated in order as in FIG. 3 is illustrated in FIGS. 7A and 7B and 8A and 8B. The horizontal axis is the thickness $t_{Fe}$ of the Fe film and the vertical axis is the thickness $t_{pd}$ of the Pd film. The meanings of the contours and ○ and ● in the FIGS. 7A and 7B and 8A and 8B are the same as in FIGS. 4A and 4B and 5A and 5B described above.

FIGS. 7A and 7B and 8A and 8B respectively illustrates the results after a heating process in a case when the annealing temperature is 300° C., 350° C., 400° C., and 450° C.

It is seen from FIGS. 7A and 7B and 8A and 8B that in a case when Pd is used instead of Ni, although a complete vertical magnetization film is not formed with a heating process of 300° C. or 350° C., a vertical magnetization film in obtained with a heating process of equal to or greater than 400° C.

In particular, with regard to the ● samples in which (Mr, Ms) is equal to or greater than 0.5, in a case when the Fe film and the Pd film are formed in order from the MgO film side, if the film thickness of the Fe film is between 0.5 and 0.7 nm and the film thickness of the Pd film is between 1.5 and 2.5 nm, by setting the annealing temperature to an appropriate range of between 400° C. and 450° C., favorable vertical magnetic anisotropy is obtained.

That is, even in a case when the Fe film and the Pd film are used, by forming the vertical magnetization film that is the storage layer 17 or the magnetization fixed layer 15 by such film thickness conditions, it is possible to realize a non-volatile memory with high heat resistance, which is easily applied to a semiconductor process, and which has excellent producibility.

[2-3: Fe—$Ni_{85}B_{15}$]

Next, measurement was performed with a sample using $Ni_{85}B_{15}$.

Figure 9A:
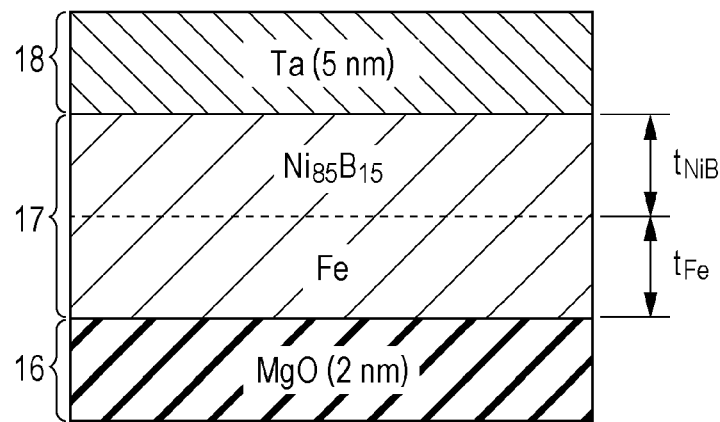
FIGS. 9A and 9B are diagrams that illustrate a film configuration on which a magnetization characteristic measurement is performed, and the change in the vertical anisotropic magnetic field with respect to the Fe film thickness (tFe) and the NiB film thickness (tNiB) of MgO, Fe, $Ni_{85}B_{15}$, and Ta after a heating process of 300° C.

That is, as the sample, as illustrated in FIG. 9A, 2 nm of MgO was formed on a silicon substrate with an oxide covering, and the Fe film and the $Ni_{85}B_{15}$ film were formed thereon, and 5 nm of Ta was formed as a protective film. That is, the Ni film of FIG. 3 is substituted by Ni including 15 atomic % of B (boron).

In such a case, it is considered that the MgO film, the Fe film and the $Ni_{85}B_{15}$ film, and the Ta layer are respectively models for the insulating layer 16, the storage layer 17, and the cap layer 18. Alternatively, the MgO film, the Fe film and the $Ni_{85}B_{15}$ film, and the Ta layer may be considered as the insulating layer 16, the magnetization fixed layer 15, and the base layer 14.

Figure 10A:
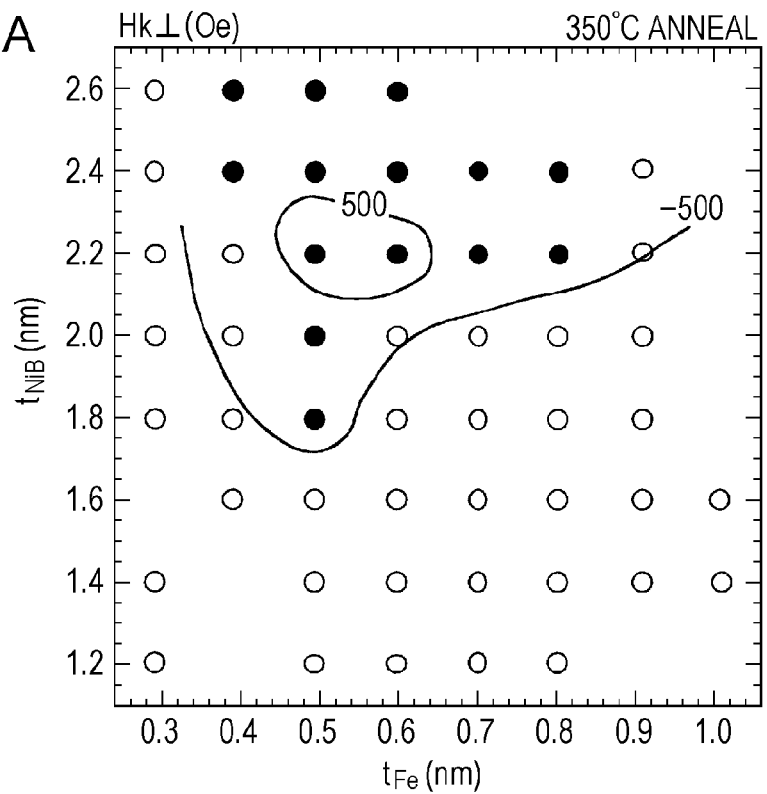
FIGS. 10A to 10B are diagrams that illustrate the change in the vertical anisotropic magnetic field with respect to the Fe film thickness (tFe) and the NiB film thickness (tNiB) of MgO, Fe, $Ni_{85}B_{15}$, and Ta after heating processes of 350° C. and 400° C.
Figure 10B:
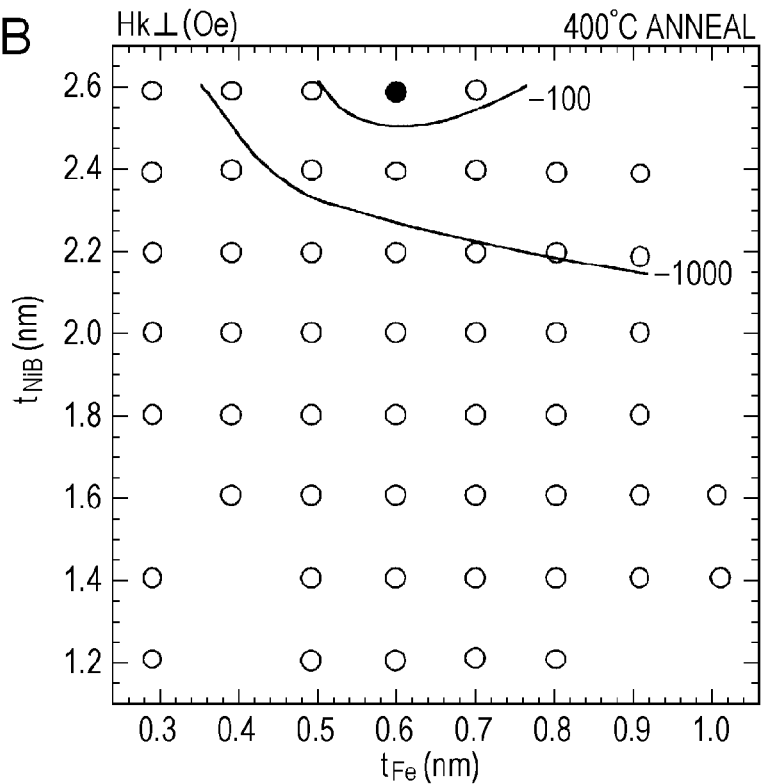

The vertical magnetic anisotropic magnetic field (Hk⊥) in a case when the thickness of Fe is $t_{Fe}$ and the thickness of NiB is $t_{NiB}$ in a film in which MgO, Fe, $Ni_{85}B_{15}$, and Ta are laminated in order as in FIG. 9A is illustrated in FIGS. 9A and 10A and 10B. The horizontal axis is the thickness $t_{Fe}$ of the Fe film and the vertical axis is the thickness $t_{NiB}$ of the $Ni_{85}B_{15}$ film. The meanings of the contours and ○ and ● are the same as in FIGS. 4A and 4B and 5A and 5B described above.

Figure 9B:
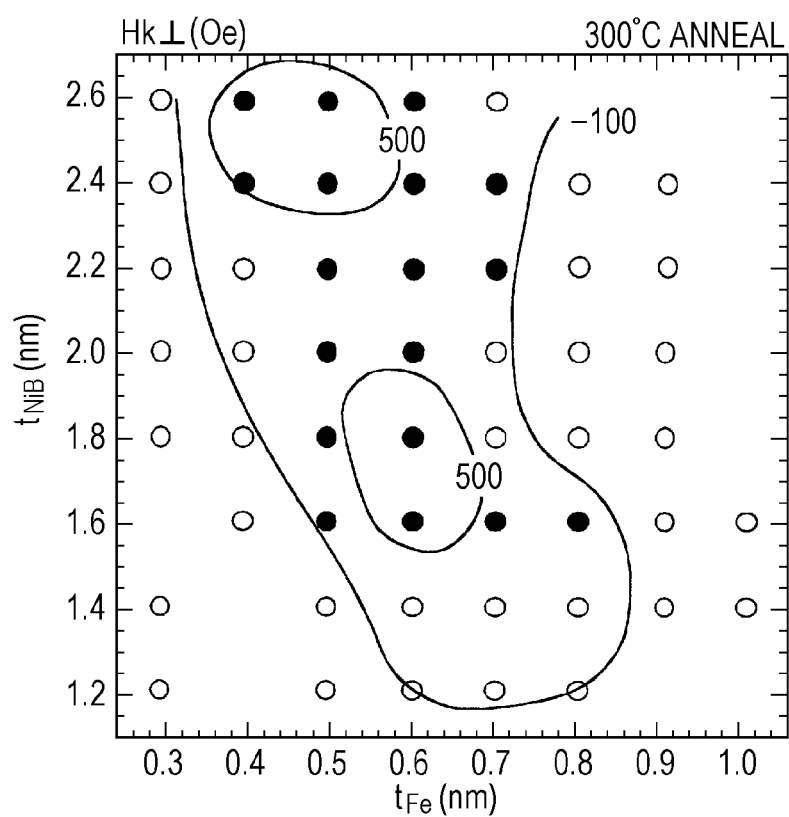

FIGS. 9B and 10A and 10B are respectively the results of heating processes at 300° C., 350° C., and 400° C.

In such a case, although regions in which the vertical magnetic anisotropy is favorable shrink when the heating temperature is increased, there are regions in which vertical magnetization is obtained even after a heating process of 400° C.

In particular, with regard to the ● samples in which (Mr, Ms) is equal to or greater than 0.5, in a case when the Fe film and the $Ni_{85}B_{15}$ film are formed in order from the MgO film side, if the film thickness of the Fe film is between 0.4 and 0.8 nm and the film thickness of the $Ni_{85}B_{15}$ film is between 1.6 and 2.6 nm, by setting the annealing temperature to an appropriate range of between 300° C. and 400° C., favorable vertical magnetic anisotropy is obtained.

That is, even in a case when the Fe film and the $Ni_{85}B_{15}$ film are used, by forming the vertical magnetization film that is the storage layer 17 or the magnetization fixed layer 15 by such film thickness conditions, it is possible to realize a non-volatile memory with high heat resistance, which is easily applied to a semiconductor process, and which has excellent producibility.

[2-4: Fe—$Ni_{90}B_{10}$]

Next, an experiment was conducted by changing the ratio of B in the NiB film.

Figure 11A:
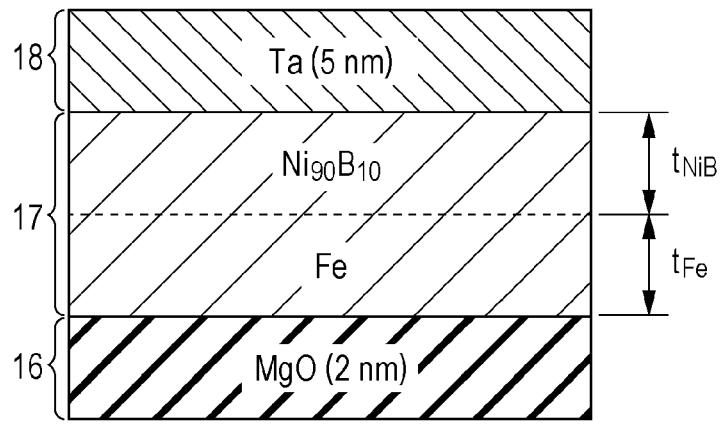
FIGS. 11A and 11B are diagrams that illustrate a film configuration on which a magnetization characteristic measurement is performed, and the change in the vertical anisotropic magnetic field with respect to the Fe film thickness (tFe) and the NiB film thickness (tNiB) of MgO, Fe, $Ni_{90}B_{10}$, and Ta after a heating process of 300° C.

As the sample, as illustrated in FIG. 11A, 2 nm of MgO was formed on a silicon substrate with an oxide covering, and the Fe film and an $Ni_{90}B_{10}$ film were formed thereon, and 5 nm of Ta was formed. That is, the NiB film has a composition of including 10 atomic % of B.

In such a case, it is still considered that the MgO film, the Fe film and the $Ni_{90}B_{10}$ film, and the Ta layer are respectively the insulating layer 16, the storage layer 17, and the cap layer 18. Alternatively, the MgO film, the Fe film and the $Ni_{90}B_{10}$ film, and the Ta layer may be considered as the insulating layer 16, the magnetization fixed layer 15, and the base layer 14.

Figure 12A:
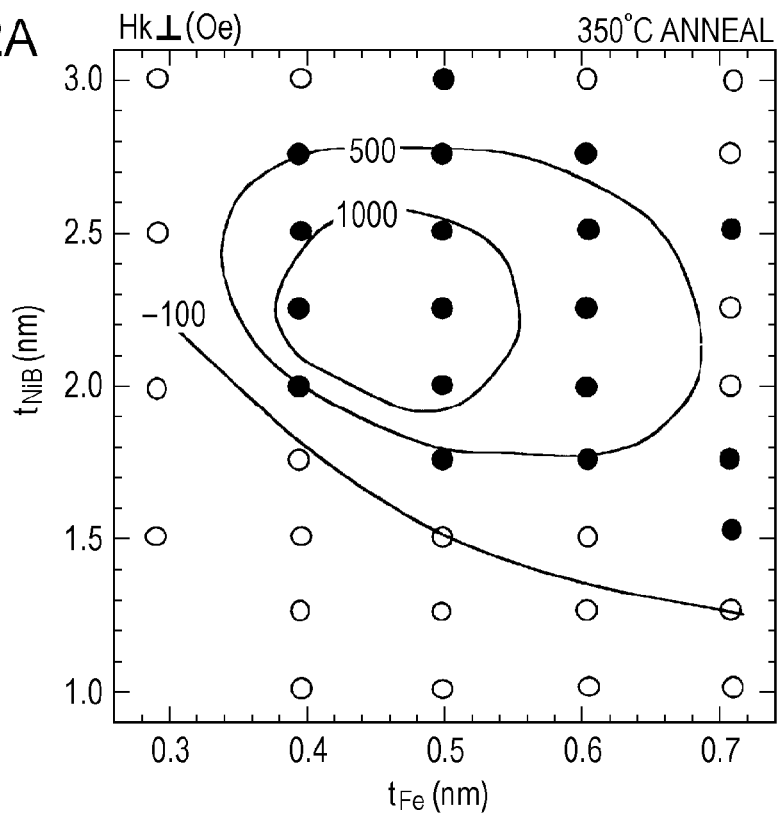
FIGS. 12A and 12B are diagrams that illustrate the change in the vertical anisotropic magnetic field with respect to the Fe film thickness (tFe) and the NiB film thickness (tNiB) of MgO, Fe, $Ni_{90}B_{10}$, and Ta after heating processes of 350° C. and 400° C.
Figure 12B:
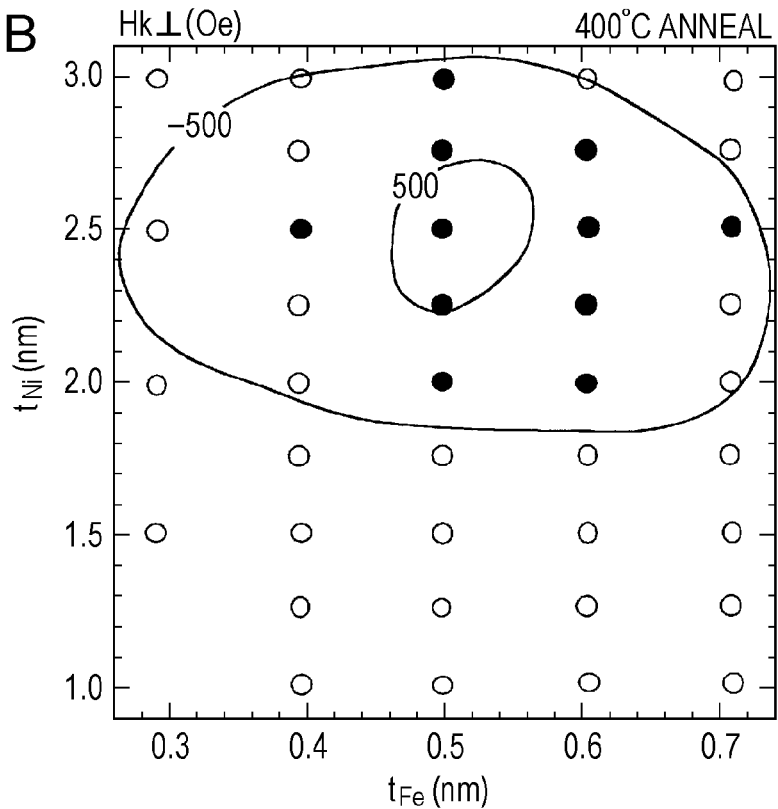

The vertical magnetic anisotropic magnetic field (Hk⊥) in a case when the thickness of Fe is $t_{Fe}$ and the thickness of NiB is $t_{NiB}$ in a film in which MgO, Fe, $Ni_{90}B_{10}$, and Ta are laminated in order as in FIG. 11A is illustrated in FIGS. 11A and 12A and 12B. The horizontal axis is the thickness $t_{Fe}$ of the Fe film and the vertical axis is the thickness $t_{NiB}$ of the $Ni_{90}B_{10}$ film. The meanings of the contours and ○ and ● are the same as in FIGS. 4A and 4B and 5A and 5B described above.

Figure 11B:
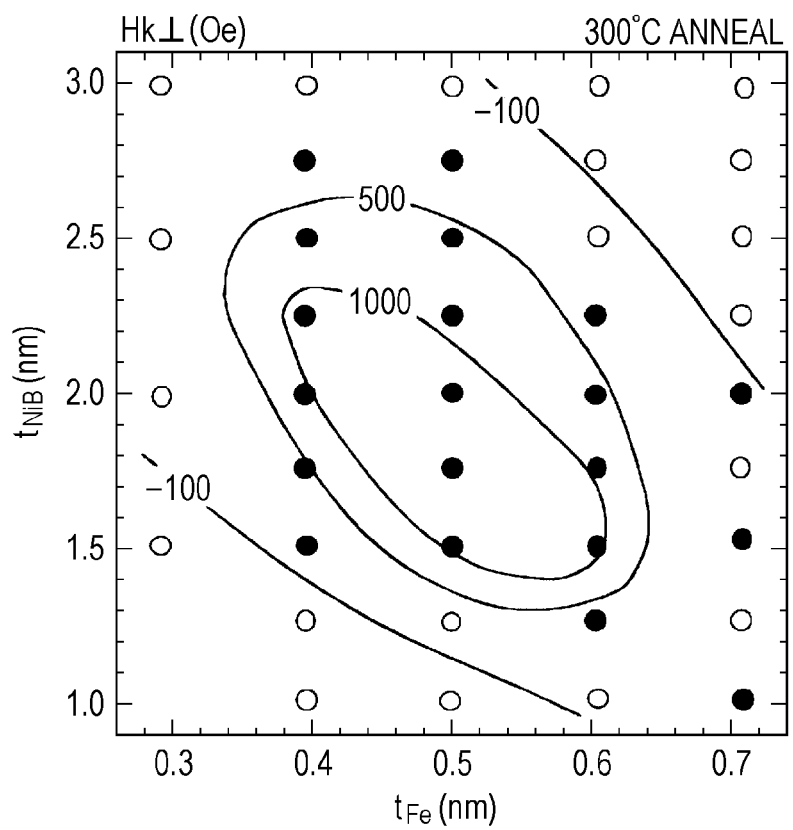

FIGS. 11B and 12A and 12B are respectively the results of heating processes at 300° C., 350° C., and 400° C.

In such a case, although regions in which the vertical magnetic anisotropy is favorable still shrink when the heating temperature is increased, there are regions in which vertical magnetization is obtained even after a heating process of 400° C.

In particular, with regard to the ● samples in which (Mr, Ms) is equal to or greater than 0.5, in a case when the Fe film and the $Ni_{90}B_{10}$ film are formed in order from the MgO film side, if the film thickness of the Fe film is between 0.4 and 0.7 nm and the film thickness of the $Ni_{90}B_{10}$ film is between 1.0 and 3.0 nm, by setting the annealing temperature to an appropriate range of between 300° C. and 400° C., favorable vertical magnetic anisotropy is obtained.

That is, even in a case when the Fe film and the $Ni_{90}B_{10}$ film are used, by forming the vertical magnetization film that is the storage layer 17 or the magnetization fixed layer 15 by such film thickness conditions, it is possible to realize a non-volatile memory with high heat resistance, which is easily applied to a semiconductor process, and which has excellent producibility.

[2-5: NiB Composition Dependence in Fe—NiB]

Figure 13A:
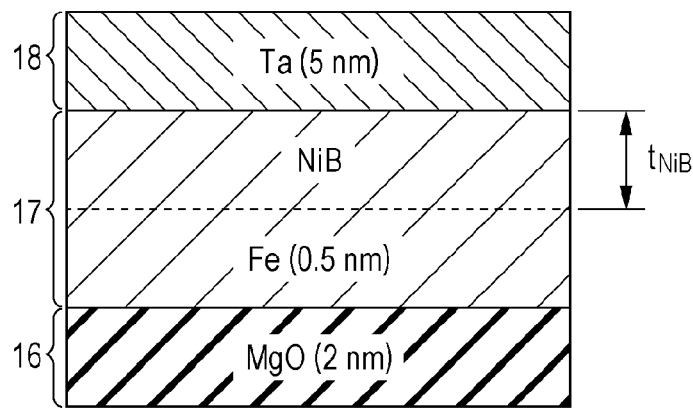
FIGS. 13A and 13B are diagrams that illustrate a film configuration on which a magnetization characteristic measurement is performed, and the NiB thickness dependence of the vertical anisotropic magnetic field with respect to each NiB composition of the films of MgO, Fe, NiB, and Ta after a heating process of 350° C.

Here, as illustrated in FIG. 13A, in a film configuration in which MgO (2 nm), Fe, NiB, and Ta (5 nm) are laminated, fixing the thickness of Fe to 0.5 nm so that vertical magnetization is relation easily obtained and changing the composition of NiB, the vertical anisotropic magnetic field with respect to the respective film thicknesses of NiB was measured. The results thereof are illustrated in FIG. 13B.

As the composition of the NiB film, the atomic % of B was set to 10 atomic %, 15 atomic %, and 20 atomic %, and measurement was performed in a case when the thickness of the NiB film differed for each composition.

Figure 13B:
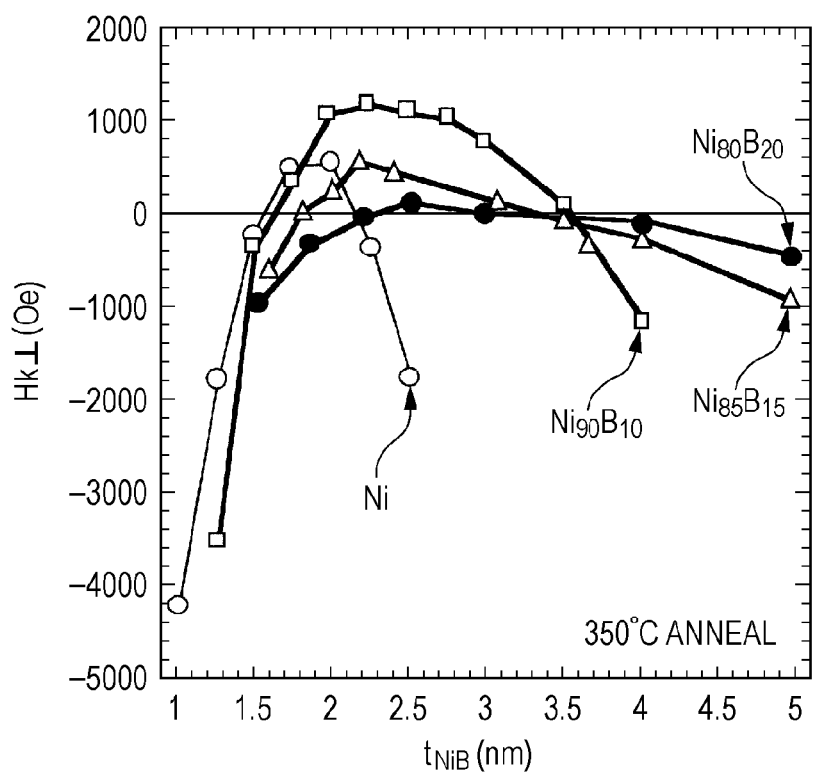

In FIG. 13B, the horizontal axis is the thickness of the NiB film and the vertical axis is the vertical magnetic anisotropic magnetic field Hk⊥ (Oe). Further, the heating temperature was 350° C. For the purposes of comparison, the Ni film of FIG. 3 is also illustrated in addition to the NiB film.

From FIG. 13B, the greater the addition amount of B, the smaller the change in the vertical anisotropic magnetic field with respect to the film thickness of NiB, and the wider the range within which vertical magnetization is obtained. In particular, the maximum value of the anisotropic magnetic field is the highest around 10 atomic % of B.

From the above results, it is said that the addition amount of B with respect to Ni is preferably equal to or less than 20 atomic %.

Further, in comparison with a case when B is not added (in the case of the Ni film), when B is added, the freedom or the margin of thickness of the film that includes Ni which is formed over the Fe film is increased.

[2-6: Film Thickness Dependence in Fe-(Various Types of Ni and Pd)]

Next, a case when various types of films are used as the film that is formed over the Fe film will be described.

Figure 14A:
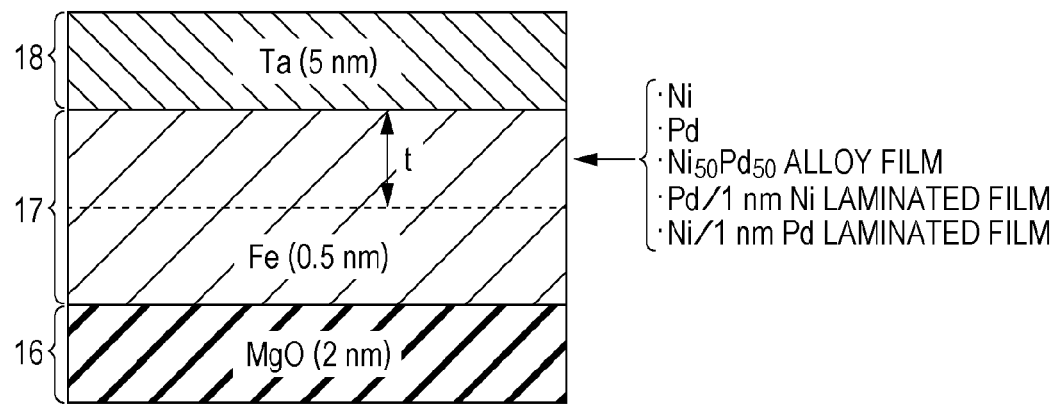
FIGS. 14A and 14B are diagrams that illustrate a film configuration on which a magnetization characteristic measurement is performed, and the Ni and Pd thickness dependence of the vertical anisotropic magnetic field when the configuration of Ni—Pd is changed in the films of MgO, Fe, Ni—Pd, and Ta after a heating process of 400° C.

As illustrated in FIG. 14A, the structure of each sample is MgO (2 nm), Fe, the film of the shaded portion, and Ta (5 nm).

As the shaded portion, each sample of an Ni film, a Pd film, an $Ni_{50}Pd_{50}$ alloyed film, a Pd and Ni laminated film, and an Ni and Pd laminated film was used. The film thickness of such a shaded portion is t.

The $Ni_{50}Pd_{50}$ alloyed film is an alloyed film in which there is 50 atomic % of both Ni and Pd.

The Pd and Ni laminated film is a film in which the Pd film is formed over the Fe film and the Ni film of a thickness of 1 nm is laminated thereon.

The Ni and Pd laminated film is a film in which the Ni film is formed over the Fe film and the Pd film of a thickness of 1 nm is laminated thereon.

Figure 14B:
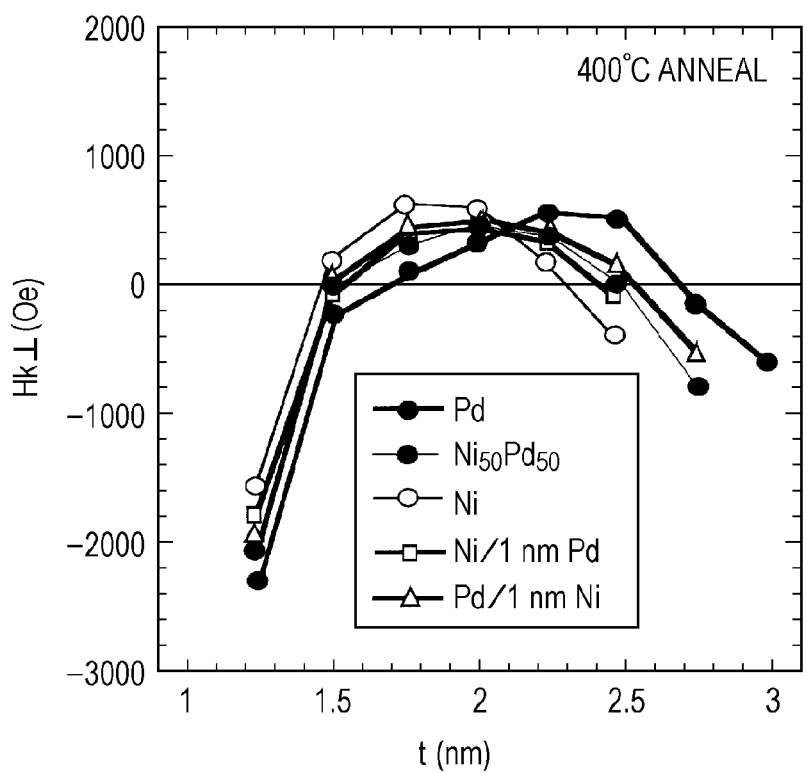

The results are illustrated in FIG. 14B. The heating temperature was 400° C. The horizontal axis is the film thickness t of the shaded portion of FIG. 14A and the vertical axis is the vertical magnetic anisotropic magnetic field Hk⊥ (Oe).

Here, in a case of the Pd and Ni laminated film or the Ni and Pd laminated film, the film thickness t is the combined film thickness of the Pd film and the Ni film.

From FIG. 14B, it is seen that in a case when an alloyed or laminated film of Ni and Pd is used, the characteristics between Ni alone and Pd alone are exhibited. Therefore, the composition or the film thickness of the laminate may be adjusted as necessary.

[2-7: Composition Dependence in FeCo—NiB]

Next, the vertical anisotropic magnetic field was investigated in a case when Co was added to the Fe film.

Figure 15A:
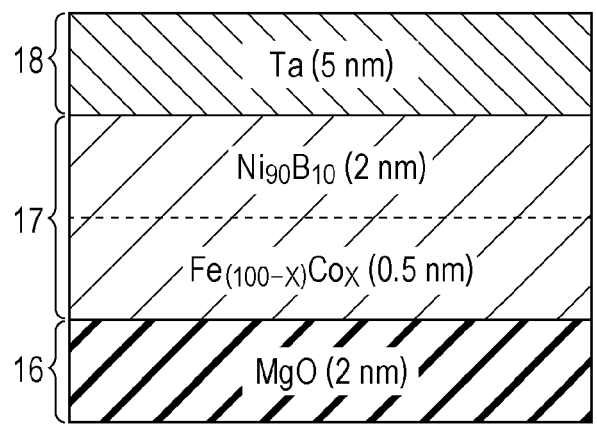
FIGS. 15A and 15B are diagrams that illustrate a film configuration on which a magnetization characteristic measurement is performed, and the Fe—Co composition dependence of the vertical anisotropic magnetic field of the films of MgO, Fe—Co, $Ni_{90}B_{10}$), and Ta after a heating process of 350° C.

As illustrated in FIG. 15A, the film configuration was 2 nm of MgO, 0.5 nm of FeCo, 2 nm of $Ni_{90}B_{10}$, and 5 nm of Ta, and the heating process was performed at 350° C.

The FeCo film was $Fe_{(100-x)}Co_x$, and Co was added as X atomic %.

Figure 15B:
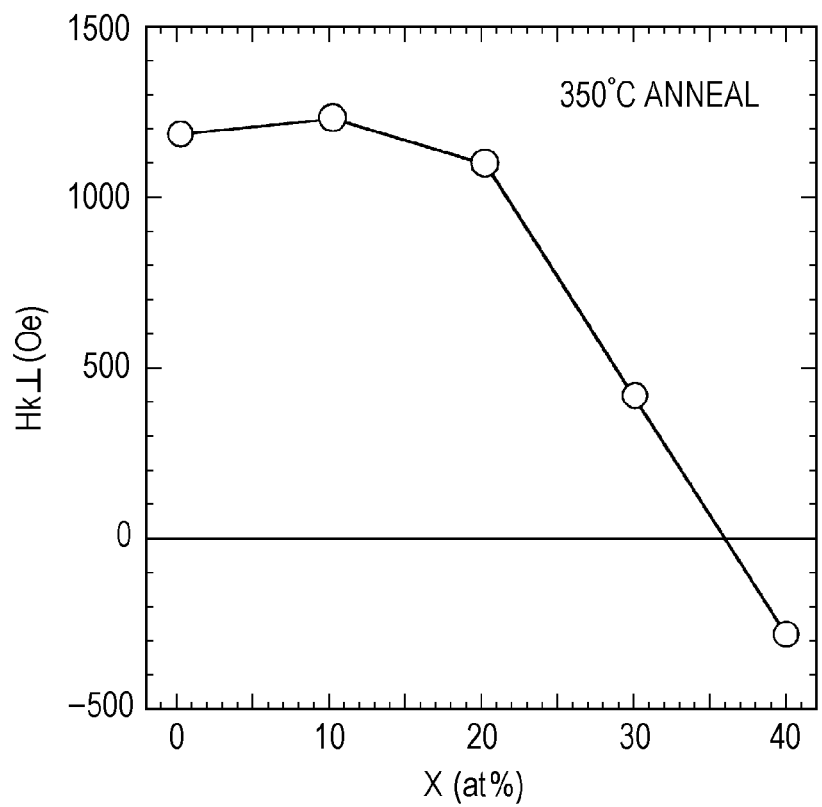

The vertical anisotropic magnetic field Hk⊥ (Oe) in a case when the Co addition amount (X atomic %) is changed is illustrated in FIG. 15B.

Although there is little change in the vertical magnetization up to a Co addition of 20 atomic % to Fe, the vertical magnetic anisotropy decreases with any further addition, and vertical magnetization is only able to be maintained (the vertical anisotropic magnetic field Hk⊥ is a positive value) up to a Co addition of 30 atomic %.

That is, in a case when adding Co to the Fe film, it is appropriate to add equal to or less than 30 atomic % of Co.

[2-8: Film Thickness Dependence in Fe—Ni—Fe]

Next, a case in which the MgO layer is formed above and below will be described.

Figure 16A:
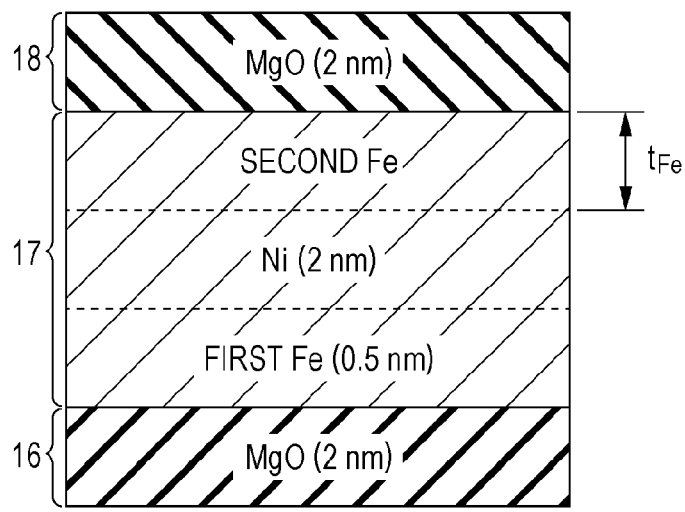
FIGS. 16A and 16B are diagrams that illustrate a film configuration on which a magnetization characteristic measurement is performed, and the change of the vertical anisotropic magnetic field with respect to the film thickness of the Fe layer that is on the upper side of the films of MgO, Fe, Ni, Fe, and MgO after a heating process of 400° C.

As illustrated in FIG. 16A, as the sample, 2 nm of MgO, the first Fe film, the Ni film, the second Fe film, and 2 nm of MgO were formed over a silicon substrate with an oxide covering.

In such a case, the MgO film on the lower side of the drawing, the first Fe film, the Ni film, and the second Fe film, and the MgO film at the upper side of the drawing may respectively be considered the insulating layer 16, the storage layer 17, and the cap layer 18.

Alternatively, the MgO film on the lower side of the drawing, the first Fe film, the Ni film, and the second Fe film, and the MgO film at the upper side of the drawing may also be respectively considered the base layer 14, the magnetization fixed layer 15, and the insulating layer 16.

The film thickness of the first Fe film was 0.5 nm and the film thickness of the Ni film was 2 nm. Furthermore, a sample in which the film thickness $t_{Fe}$ of the second Fe film was changed was prepared.

Figure 16B:
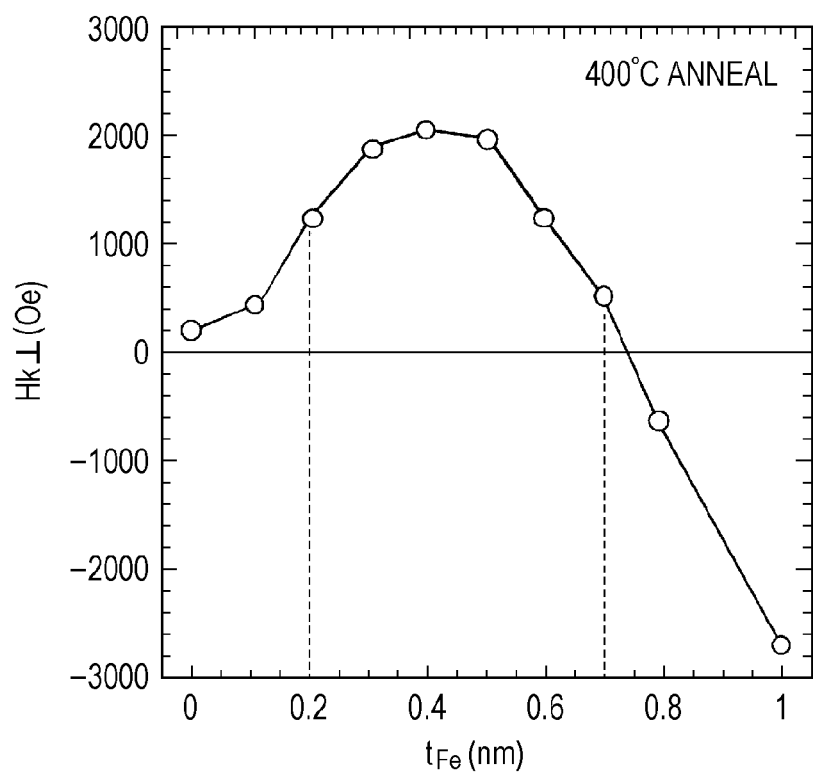

The Fe thickness dependence of the vertical anisotropic magnetic field Hk⊥ (Oe) in a case when the film thickness $t_{Fe}$ of the second Fe film is changed is illustrated in FIG. 16B. The heating temperature was set to 400° C.

The increase in the vertical anisotropic magnetic field when the thickness of the second Fe film is equal to or greater than 0.2 nm and equal to or less than 0.7 nm is striking.

In such a manner, in a case when providing an oxide layer (for example, an MgO layer) above and below a layer that is equivalent to the storage layer 17 or the magnetization fixed layer 15, by arranging the Fe film on the interface with the oxide layer above and below, the interface magnetic anisotropy on the interface above and below is strengthened, which is advantageous for the formation of the vertical magnetic film.

That is, at least one of the storage layer 17 and the magnetization fixed layer 15 has a configuration of being interposed between the insulating layer 16 of an oxide and another oxide layer (cap layer 18 or base layer 14), in which the first Fe film, the Ni film, and the second Fe film are formed in order from the interface side that is in contact with the insulating 16, and the second Fe film is in contact with the other oxide layer. In such a case, it is appropriate that the film thickness of the second Fe film be between 0.2 and 0.7 nm.

[2-9: Graded Composition Distribution of Fe, Ni]

Figure 17:
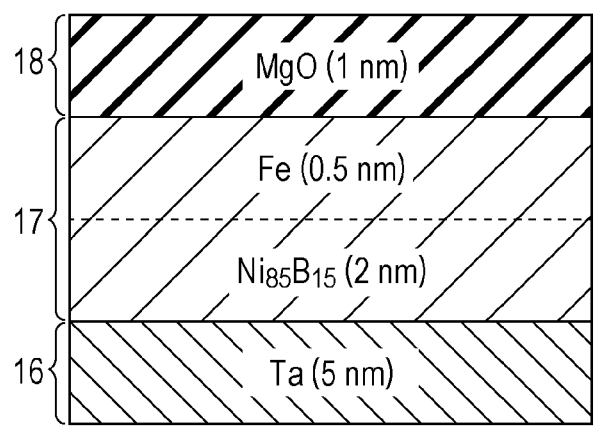
FIG. 17 is an explanatory diagram of a film configuration on which a magnetization characteristic measurement is performed.

Next, as illustrated in FIG. 17, the change in the composition ratio of Fe/(Ni+Fe) on the interface with MgO and the vertical magnetic anisotropy to changes in the heating temperature was investigating by forming 5 nm of the Ta layer, 2 nm of the $Ni_{85}B_{15}$ film, 0.5 nm of the Fe film, and 1 nm of the MgO layer in that order.

Analysis of the composition was performed by mass analysis of the atoms that scatter during ion etching.

Figure 18A:
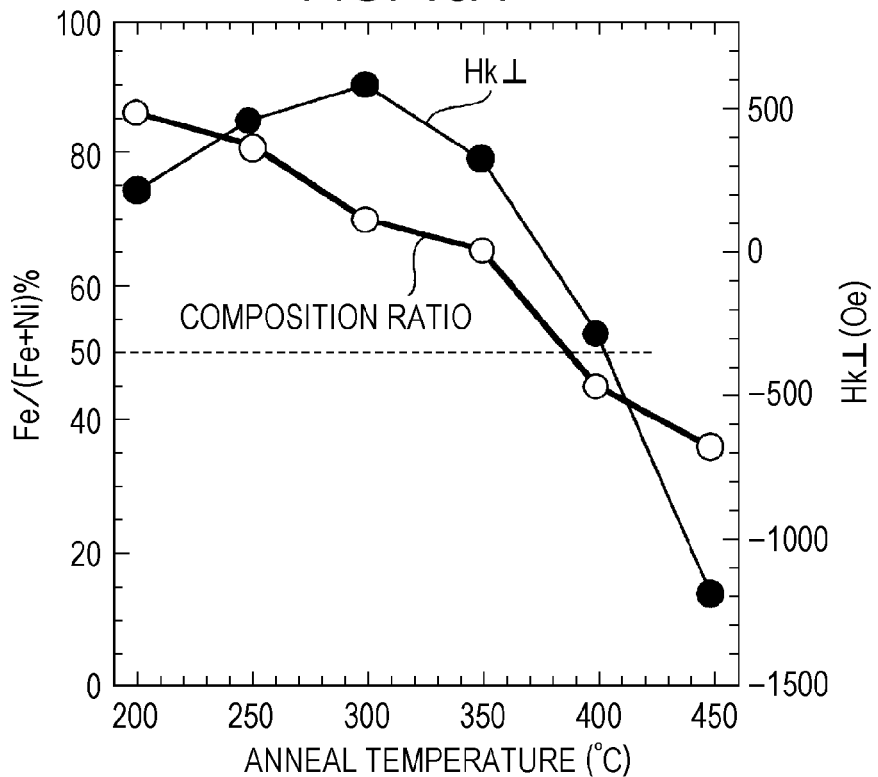
FIGS. 18A and 18B are diagrams that illustrate the change in the vertical anisotropic magnetic field of the composition ratio of Fe in the vicinity of the MgO interface with respect to the total of Fe and Ni with respect to the heating temperature of the films of Ta, $Ni_{85}B_{15}$, Fe, and MgO, and the change in the composition ratio depth direction of Fe and Ni before a heating process and after a heating process of 300° C.

The Fe composition ratio Fe/(Ni+Fe) on the interface with the MgO layer (left vertical axis: %) and the vertical magnetic anisotropy Hk⊥ (right vertical axis: Oe) to the annealing temperature (horizontal axis) are illustrated in FIG. 18A.

As the heating temperature rises, Fe and Ni scatter and the Fe composition ratio of the interface with the MgO layer decreases. In particular, beyond a heating process of 400° C. at which the Fe composition ratio falls to 50% or less, it is seen that the vertical magnetic anisotropy Hk⊥ is greatly decreased.

Figure 18B:
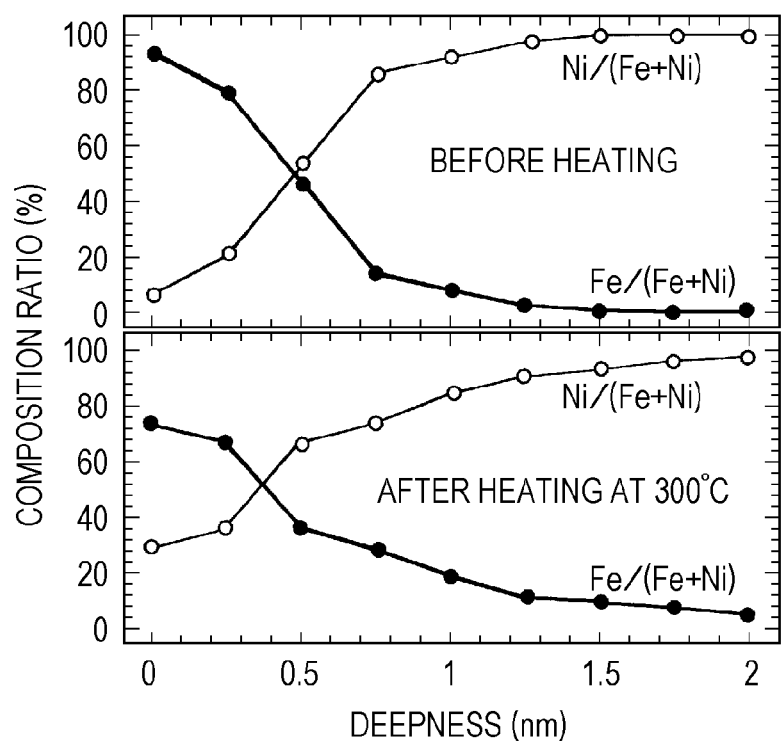

FIG. 18B plots the composition ratio of Fe and Ni in the depth direction (thickness direction) before and after a heating process of 300° C. of the sample described above. A depth of "0" is set to around the interface with the MgO layer.

From the drawing, it is seen that Fe and Ni are scattered by the heating process to form a graded composition film.

From such an experiment, it is seen that in a layer as the storage layer 17 or the magnetization fixed layer 15, on the interface of the insulating layer 16, the Fe composition is appropriate as equal to or greater than 50%.

Furthermore, although in the Fe film and the film that includes Ni, Fe and Ni scatter from a heating process and a graded composition distribution is formed, even in the cases described in FIGS. 3, 9A and 9B, 11A and 11B, 13A, 14A, 15A, and 16A, a graded composition distribution of Fe and Ni is formed. Here, with such layer structures, it is appropriate to form a graded composition distribution in which the Fe composition is equal to or greater than 50% on the interface of the insulating layer 16 in a state after the heating process.

That is, in the embodiments, if the respective film thicknesses of the Fe film and the Ni film (or an NiB film or an alloyed film or a laminated film of Ni and Pd) are set to the respective film thicknesses described above and the heating temperature is appropriately set, a storage element in which a graded composition distribution in which the composition ratio of Fe to Ni on the interface side with the insulating layer 16 is equal to or greater than 50% is formed after the heating process is able to be formed.

The present disclosure contains subject matter related to that disclosed in Japanese Priority Patent Application JP 2010-276590 filed in the Japan Patent Office on Dec. 13, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A storage element comprising:
a storage layer with orientation of magnetization that changes according to changes in and depends on information stored in the storage layer;
a magnetization fixed layer with magnetization that is vertical to a film surface of the magnetization fixed layer that is to be a reference for information that is stored in the storage layer; and
an insulating layer comprising an oxide and which is provided between the storage layer and the magnetization fixed layer,
wherein,
by injecting spin-polarized electrons in a laminating direction of a layered structure that includes the storage layer, the insulating layer, and the magnetization fixed layer, an orientation of magnetization of the storage layer changes and recording of information is performed in the storage layer,
at least one of the storage layer and the magnetization fixed layer comprises a structure having a graded composition distribution of Ni and Fe that is formed by heating an entity comprising at least a first film and a second film that are formed in this order from an interface of the structure that is in contact with the insulating layer, the graded composition distribution of Ni and Fe in the structure being such that a composition ratio of Ni with respect to Fe at the interface is greater than zero,
the first film is an Fe film that consists of Fe, and
the second film contains Ni.

2. The storage element according to claim 1, wherein:
the structure is interposed between the insulating layer and another layer, the another layer comprising an oxide,
the structure further comprises a third film that is disposed over the second film, and
the third film comprises an Fe film having a thickness between 0.2 and 0.7 nm.

3. The storage element according to claim 1, wherein the second film is an NiB film including equal to or less than 20 atomic % of B.

4. The storage element according to claim 1, wherein the second film is an alloyed film or a laminated film of Ni and Pd.

5. The storage element according to claim 1, wherein the graded composition distribution is such that a composition ratio of Fe with respect to Ni at the interface of the structure that is in contact with the insulating layer is equal to or greater than 50%.

6. The storage element of claim 1, wherein:
the second film is an Ni film,
the Fe film has a film thickness of between 0.4 and 0.5 nm, and
the Ni film has a film thickness of between 1.7 and 2.5 nm.

7. The storage element of claim 1, wherein:
the second film is an NiB film including substantially 15 atomic % of B,
the Fe film has a film thickness of between 0.4 and 0.8 nm, and
the NiB film has a film thickness of between 1.6 and 2.6 nm.

8. The storage element of claim 1, wherein:
the second film is an NiB film including substantially 10 atomic % of B,
the Fe film has a film thickness of between 0.4 and 0.7 nm, and
the NiB film has a film thickness of between 1.0 and 3.0 nm.

9. A storage element comprising:
a storage layer with orientation of magnetization that changes according to changes in and depends on information stored in the storage layer;
a magnetization fixed layer with magnetization that is vertical to a film surface of the magnetization fixed layer that is to be a reference for information that is stored in the storage layer; and
an insulating layer comprising an oxide and which is provided between the storage layer and the magnetization fixed layer,
wherein,
by injecting spin-polarized electrons in a laminating direction of a layered structure that includes the storage layer, the insulating layer, and the magnetization fixed layer, an orientation of magnetization of the storage layer changes and recording of information is performed in the storage layer,
at least one of the storage layer and the magnetization fixed layer comprises a structure having a graded composition distribution of Ni and Fe that is formed by heating an entity comprising at least a first film and a second film that are formed in this order from an interface of the structure that is in contact with the insulating layer,
the first film is an Fe film,
the second film is an Ni film,
the Fe film has a film thickness of between 0.4 and 0.5 nm, and
the Ni film has a film thickness of between 1.7 and 2.5 nm.

10. The storage element according to claim 9, wherein Co of equal to or less than 30 atomic % is added to the Fe film.

11. A storage element comprising:
a storage layer with orientation of magnetization that changes according to changes in and depends on information stored in the storage layer;
a magnetization fixed layer with magnetization that is vertical to a film surface of the magnetization fixed layer that is to be a reference for information that is stored in the storage layer; and
an insulating layer comprising an oxide and which is provided between the storage layer and the magnetization fixed layer,
wherein,
by injecting spin-polarized electrons in a laminating direction of a layered structure that includes the storage layer, the insulating layer, and the magnetization fixed layer, an orientation of magnetization of the storage layer changes and recording of information is performed in the storage layer,
at least one of the storage layer and the magnetization fixed layer comprises a structure having a graded composition distribution of Ni and Fe that is formed by heating an entity comprising at least a first film and a second film that are formed in this order from an interface of the structure that is in contact with the insulating layer,
the first film is an Fe film,
the second film is an NiB film including substantially 15 atomic % of B,
the Fe film has a film thickness of between 0.4 and 0.8 nm, and
the NiB film has a film thickness of between 1.6 and 2.6 nm.

12. A storage element comprising:
a storage layer with orientation of magnetization that changes according to changes in and depends on information stored in the storage layer;
a magnetization fixed layer with magnetization that is vertical to a film surface of the magnetization fixed layer that is to be a reference for information that is stored in the storage layer; and
an insulating layer comprising an oxide and which is provided between the storage layer and the magnetization fixed layer,
wherein,
by injecting spin-polarized electrons in a laminating direction of a layered structure that includes the storage layer, the insulating layer, and the magnetization fixed layer, an orientation of magnetization of the storage layer changes and recording of information is performed in the storage layer,
at least one of the storage layer and the magnetization fixed layer comprises a structure having a graded composition distribution of Ni and Fe that is formed by heating an entity comprising at least a first film and a second film that are formed in this order from an interface of the structure that is in contact with the insulating layer,
the first film is an Fe film,
the second film is an NiB film including substantially 10 atomic % of B,
the Fe film has a film thickness of between 0.4 and 0.7 nm, and
the NiB film has a film thickness of between 1.0 and 3.0 nm.

13. A memory device comprising:
a storage element that retains information by a magnetization state of a magnetic body; and
two types of wiring that intersect each other,
wherein,
the storage element has a configuration including:
(a) a storage layer with an orientation of magnetization that changes according to changes in and depends on information stored in the storage layer,
(b) a magnetization fixed layer with magnetization that is vertical to a film surface of the magnetization fixed layer that is to be a reference for information that is stored in the storage layer, and
(c) an insulating layer comprising an oxide and which is provided between the storage layer and the magnetization fixed layer,
by injecting spin-polarized electrons in a laminating direction of a layered structure that includes the storage layer, the insulating layer, and the magnetization fixed layer, an orientation of magnetization of the storage layer changes and recording of information is performed in the storage layer,
at least one of the storage layer and the magnetization fixed layer comprises a structure having a graded composition distribution of Ni and Fe that is formed by heating an entity comprising at least a first film and a second film that are formed in this order from an interface of the structure that is in contact with the insulating layer, the graded composition distribution of Ni and Fe in the structure being such that a composition ratio of Ni with respect to Fe at the interface is greater than zero,
the first film is an Fe film that consists of Fe,
the second film contains Ni,
the storage element is arranged between the two types of wiring, and
spin-polarized electrons are injected by a current in the laminating direction flowing to the storage element through the two types of wiring.

14. The memory device according to claim 13, wherein the graded composition distribution is such that a composition ratio of Fe with respect to Ni at the interface of the structure that is in contact with the insulating layer is equal to or greater than 50%.

* * * * *